United States Patent [19]

Kawai et al.

[11] Patent Number: 5,001,726

[45] Date of Patent: Mar. 19, 1991

[54] CIRCUIT FOR GENERATING DISCRIMINATION VOLTAGE LEVEL

[75] Inventors: Masaaki Kawai, Kawasaki; Hisako Watanabe, Machida; Tomoyuki Ohtsuka, Kawasaki, all of Japan

[73] Assignee: Fujitsu Limited, Kawasaki, Japan

[21] Appl. No.: 313,506

[22] Filed: Feb. 22, 1989

[30] Foreign Application Priority Data

Feb. 22, 1988 [JP] Japan .................................. 63-39282
Nov. 30, 1988 [JP] Japan ............................... 63-303212

[51] Int. Cl.$^5$ ........................................ H04L 25/06
[52] U.S. Cl. ........................................ 375/76; 307/358
[58] Field of Search ............... 375/76, 98; 455/38, 455/343; 328/147, 169, 171; 307/351, 358, 540, 555

[56] References Cited

U.S. PATENT DOCUMENTS

| | | | |
|---|---|---|---|
| 4,161,628 | 7/1979 | McRae | 375/76 |
| 4,535,294 | 8/1985 | Ericksen et al. | 307/358 |
| 4,540,897 | 9/1985 | Takaoka et al. | 307/268 |
| 4,575,683 | 3/1986 | Roberts et al. | 375/76 |
| 4,575,863 | 3/1986 | Butcher et al. | 307/540 |
| 4,631,737 | 12/1986 | Davis et al. | 307/358 |

FOREIGN PATENT DOCUMENTS 57-89362 6/1982 Japan .
62-271547 11/1987 Japan .

Primary Examiner—Douglas W. Olms
Assistant Examiner—Stephen Chin
Attorney, Agent, or Firm—Staas & Halsey

[57] ABSTRACT

A circuit for generating a discrimination voltage level $V_{ref}$ which is used as a reference voltage to discriminate between two adjacent logic levels or an input signal which can have a plurality of different voltage levels generally corresponding to a plurality of respective, different logic levels. The frequency at which the levels of the input signals lie in the upper half of the vicinity (i.e., the voltage range from the level $V_{ref}-\Delta V$ to the level $V_{ref}+\Delta V$) of the discrimination voltage level (i.e., the "upper half" thereof being the voltage range from $V_{ref}$ to $V_{ref}+\Delta V$, "$\Delta V$" being a predetermined off-set value) and the frequency at which the levels of the input signals lie in the lower half of the vicinity (i.e., as above defined) of the discrimination level (i.e., the "low half" thereof being the voltage range from $V_{ref}-\Delta V$ to $V_{ref}$) are compared, and the discrimination level is controlled so that the above two frequencies are the same.

9 Claims, 8 Drawing Sheets

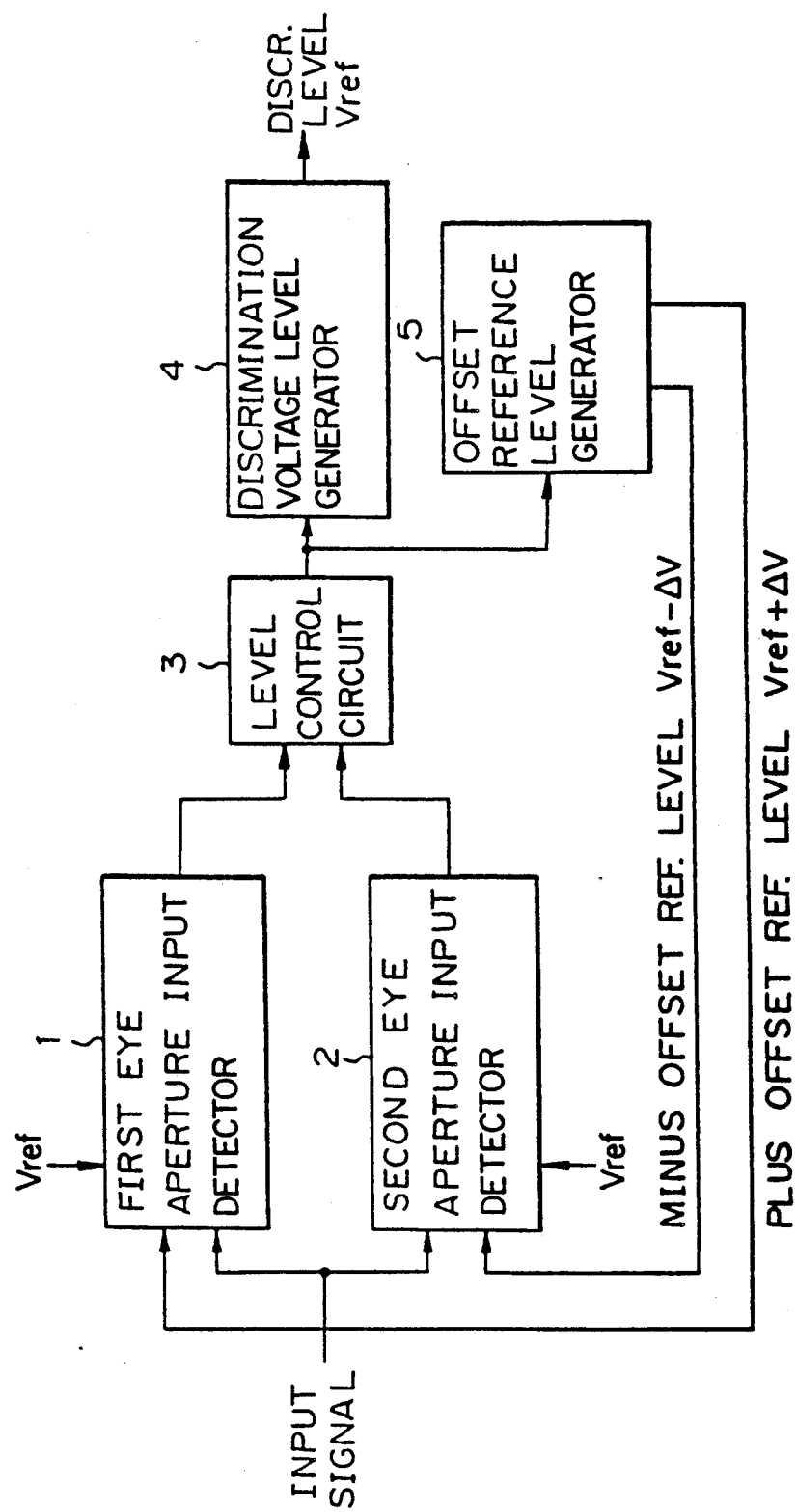

CIRCUIT FOR GENERATING DISCRIMINATION VOLTAGE LEVEL

BACKGROUND OF THE INVENTION (1) Field of the Invention

The present invention relates to a circuit for generating a discrimination voltage level which is used as a reference voltage level to discriminate between two adjacent logic levels of an input signal which can have a plurality of different voltage levels generally corresponding to a plurality of respective, different logic levels.

Generally, in the field of digital systems, more particularly, in digital communication technology, digital signals can be in a state corresponding to one of two or more predetermined discrete levels, e.g., two-state signals can be in a high level state (hereinafter called H level) or in a low level state (hereinafter called L level).

When digital signals as mentioned above are output from one unit and received by another unit, sometimes it is necessary to recognize the level (or state) of the received signal, for example, in regenerative repeaters located along transmission lines on which digital signals are transmitted, digital signals transmitted on a transmission line and received in the regenerative repeaters are amplified, reshaped, retimed, and retransmitted on the transmission line. To retransmit the received digital signals, the repeaters must know the level of each received signal, i.e., at which level each output signal should be sent out as a regenerated digital signal. For recognizing the level (or state) of the received signal, (voltage level) discrimination circuits are provided, for example, in the regenerative repeaters or other communication system which function to receive digital signals.

A discrimination circuit generally comprises a circuit for generating a discrimination voltage level ($V_{ref}$), and the discrimination voltage level ($V_{ref}$) is used to discriminate between different levels of the received input signals, for example, in two-state systems, to discriminate between a high level and a low level, i.e., a discrimination circuit outputs a high level signal when the voltage level of an input signal is higher than the discrimination level voltage ($V_{ref}$), and outputs a low level signal when the voltage level of an input signal is lower than the discrimination voltage level ($V_{ref}$).

The voltage level of a digital signal (electric signal or optical signal), however, fluctuates in accordance with fluctuations of temperature and environmental conditions, and varies with deterioration due to age of the system in which the digital signal is generated and transmitted. Further, noise contributes to the fluctuation and variation of the level of the digital signal, when superposed on the signal, and this also varies with the temperature and environmental conditions, and deterioration due to age.

In particular, a digital signal transmitted over a long transmission line is greatly affected by the fluctuation and variations due to the above conditions, i.e., input signals to repeaters, which are generally located along a long transmission line, may be greatly fluctuated (varied) due to the fluctuations and variations of the above conditions.

Since the fluctuation of the levels of digital input signals causes a high error rate when discriminating between different levels of the input signals in a discrimination circuit, there is a great demand to minimize the effect of the above fluctuations of input signal levels in a discrimination circuit, and accordingly, to improve the reliability of the discrimination circuit, in addition to a general demand for a reduction of costs.

In particular, when used in regenerative repeaters, since the regenerative repeaters are located such that a technician can not obtain access thereto, there is a further demand that a level adjustment or another regulating operation after the repeaters are installed, be eliminated.

(2) Description of the Related Art

In the prior art, to conpensate the effect of temperature fluctuations, a temperature compensation circuit is provided in the circuit for generating a discrimination voltage level. This compensation circuit, for example, comprises a resistor having a value which varies in accordance with ambient temperature, and the discrimination voltage level is obtained from the voltage between the terminals of the resistor, so that the discrimination voltage level can be used to realize an optimum discrimination of different levels of input signals having levels which have been varied due to changes in the ambient temperature.

In the above method using a temperature compensation circuit, however, compensation for a fluctuation factor other than the temperature fluctuation is impossible, and a cumbersome operation of adjusting the initial discrimination level in each circuit for generating a discrimination voltage level must be carried out in accordance with the conditions at the location of the discrimination circuit to which the discrimination voltage level is supplied, and this causes an increase of the manufacturing costs.

Another method of decreasing the error rate in the discrimination of the level of the input signals in the prior art is to increase the system margin, i.e., to increase the noise margin, in a stage before the discrimination circuit, but, it is very expensive to provide the construction for increasing a system margin, e.g., for increasing gains in amplifiers, and the effect of this method is not satisfactory because fluctuation factors other than the fluctuation due to the superposing of noise in the stages where the system margin is increased, are not removed.

A third method of controlling the discrimination voltage level to be supplied to the discrimination circuit in the prior art is to use a data format which periodically includes one or more predetermined bits in the transmitted data, and detects the occurrence of errors by recognizing the predetermined bits using the discrimination voltage level, such as "H"→"L" (errors by recognizing a high level signal as a low level signal), and "L"→"H" (errors by recognizing a low level signal as a high level signal), and the discrimination level is controlled based on the result of the detection of the occurrence of errors.

For example, an mBIC code method is known wherein m is a natural number, e.g., when m=10, this is called a 10BIC method. Here, a redundancy bit is inserted into each ten original data bits (i.e., herein the data transfer rate is changed by 11/10 times) to form a block consisting of ten original data bits (1st ~ 10th bit in the above block), and one redundancy bit, and the redundancy bit (eleventh bit in the above block) is set as an inverted value of a predetermined one of the bits in the original data, e.g., a bit just before each redundancy bit (and thus the tenth bit in the succession of the original ten data bits). Accordingly, the occurrence of errors can be recognized by monitoring the above tenth and eleventh bits in each block.

In the above third method, however, a limitation is added to the data format, and the data transfer rate must be changed to periodically insert the above predetermined bits in the original transmitted data, and further, an additional construction for periodically detecting the above occurrence of errors, becomes necessary.

SUMMARY OF THE INVENTION

The object of the present invention is to provide a circuit for generating a discrimination voltage level, which operates independently of data format, requires no manual adjustment, and provides an optimum discrimination level regardless of the level fluctuation of an input signal or the cause thereof.

Therefore, according to the present invention, there is provided a circuit for generating a discrimination voltage level which is used as a reference voltage to discriminate between two adjacent logic levels of an input signal which can have a plurality of different voltage levels generally corresponding to a plurality of different logic levels, comprising: a discrimination level voltage generating means for generating the discrimination voltage level; an offset reference level generating means for generating a plus offset reference level which is higher than the discrimination level by a predetermined offset value, and a minus offset reference level which is lower than the discrimination level by the predetermined offset value; a first eye aperture input detecting means for detecting that the voltage of the input signal lies between the discrimination level and the plus offset reference level; a second eye aperture input detecting means for detecting that the voltage of the input signal lies between the discrimination level and the minus offset reference level; and a level control means for controlling the respective output voltage levels of the discrimination voltage level generating means and the offset reference level generating means, so that the frequencies of the detections by the first eye aperture input detecting means and the second eye aperture input detecting means are the same.

BRIEF DESCRIPTION OF THE DRAWINGS

In the drawings:

FIG. 2 shows a basic construction of the present invention;

DESCRIPTION OF THE PREFERRED EMBODIMENTS

Figure 1A:
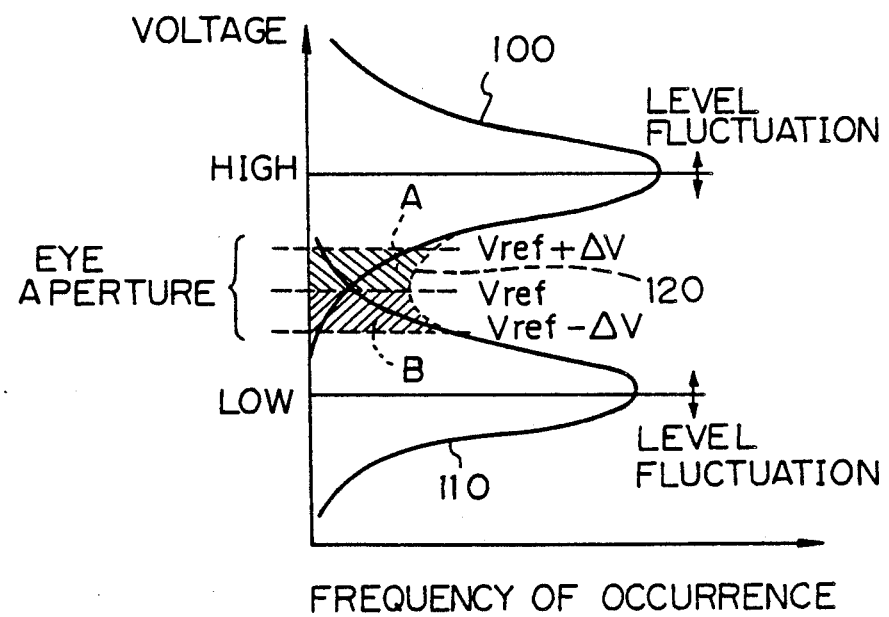
FIG. 1A shows an example of a frequency distribution of input signal voltages.

FIG. 1A shows an example of a frequency distribution of input signal voltages. In FIG. 1A, "HIGH" and "LOW" each denote logic levels without level fluctuation, which levels equal the output levels of the discrimination circuit to which the discrimination level voltage obtained by the circuit for generating a discrimination voltage level according to the present invention is supplied.

The logic levels denoted by "HIGH" and "LOW" are generally two logic levels adjacent to each other in input signals which can be in a state corresponding to one of a plurality of different logic levels, for example, a high level and a low level in two-state signals.

Figure 1B:
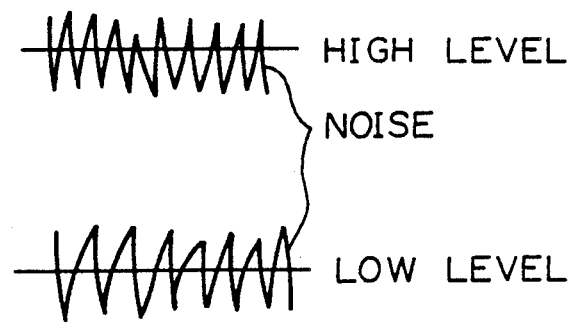
FIG. 1B shows an example of noise superposed on HIGH and LOW level signals.

FIG. 1B shows an example of noise superposed on the HIGH and LOW level signals, and mainly it is the noise superposing which causes the distribution of the input signals, which represent the HIGH and LOW level signals, to have an almost Gaussian shape, as shown in FIG. 1A. In FIG. 1A, reference numeral 100 denotes a frequency distribution of input signal voltages, which represent the HIGH level signal, and 110 denotes a frequency distribution of input signal voltages, which represent the LOW level signal.

Further, in FIG. 1A, in a range of input signal voltages between the HIGH and LOW levels, the above-mentioned two distributions 100 and 110 overlap, and in this voltage range, the actual frequency distribution of the input signal voltage is a summation of the two frequency distributions 100 and 110, as shown by a dashed line and denoted by 120 in FIG. 1A.

As shown in FIG. 1A, in the abovementioned range of voltages between the peaks of the two distributions 100 and 110, the frequency of occurrence of the summation 120 is much smaller than the frequency of occurrence of input signal frequencies in the vicinity of the peaks of the two Gaussian shapes 100 and 110, and therefore, this range of voltage between the peaks, where the frequency of signal input is much smaller than the frequency in the vicinity of the peaks, is generally called "eye aperture" or "eye opening".

Since, in the abovementioned voltage range where the above summation 120 is small, i.e., in the eye aperture range, the frequency of each of the two distributions 100 and 110 is also small, and therefore, when the discrimination voltage level is set in this range, particularly, when the discrimination voltage level is set near the center of the eye aperture, i.e., so that the vicinity of the discrimination voltage level is included in the eye aperture range, the error rate when discriminating the levels of input digital signals can be reduced.

In particular, in two-state signals, the frequency of occurrence of signal inputs representing the high level and the frequency of occurrence of signal inputs representing the LOW level are usually made as equal as possible, to prevent any deviation of a direct current level on a transmission line and a lack of timing information due to successive signals having the same value. Therefore, in two-state signals, the total frequency of occurrence of input signals representing the HIGH level and the total frequency of occurrence of input signals representing the LOW level are usually almost the same.

In the above case, as understood from FIG. 1A, in an upper half range of the eye aperture range, in practice, the frequency of received input signals representing the HIGH level is larger than the frequency of received input signals representing the LOW level, and in a lower half range of the eye aperture range, in practice, the frequency of received input signals representing the LOW level is larger than the frequency of received input signals representing the HIGH level, and therefore, when the discrimination level is set at the center voltage of the eye aperture range, which can be defined as a voltage whereat the frequency of received input signals representing the HIGH level equals the frequency of received input signals representing the LOW level, the error rate when recognizing the input signals, i.e., the sum of the frequency of recognizing an input signal representing the HIGH level as a LOW level signal, and the frequency of recognizing an input signal representing the LOW level as a HIGH level signal, is minimized.

To realize the abovementioned conditions for reducing or minimizing the error rate, a circuit for generating a discrimination voltage level according to the present invention, and having the following construction, is provided.

FIG. 2 shows, as a basic construction of the present invention, a construction of a circuit for generating a discrimination voltage level $V_{ref}$ which is used as a reference voltage to discriminate between two logic levels HIGH and LOW adjacent to each other in input signals which can be generally in a state corresponding to one of a plurality of different logic levels.

In FIG. 2, reference numeral 1 denotes a first eye aperture input detector, 2 denotes a second eye aperture input detector, 3 denotes a level control circuit, 4 denotes a discrimination voltage level generator, and 5 denotes an offset reference level generating means.

The discrimination voltage level generator 4 generates the discrimination voltage level $V_{ref}$.

The offset reference level generator 5 generates a plus offset reference level $V_{ref}+\Delta V$ which is higher than the discrimination voltage level $V_{ref}$ by a predetermined offset value $\Delta V$, and a minus offset reference voltage level $V_{ref}-\Delta V$ which is lower than the discrimination voltage level $V_{ref}$ by the predetermined offset value $\Delta V$.

The first eye aperture input detector 1 detects that the voltage level of the input signal is between the discrimination level $V_{ref}$ and the plus offset reference level $V_{ref}+\Delta V$.

The second eye aperture input detector 2 detects that the voltage level of the input signal is between the discrimination level $V_{ref}$ and the minus offset reference level $V_{ref}-\Delta V$.

The level control circuit 3 controls the output voltages of the discrimination voltage level generator means 4 and the offset reference level generator 5, so that the frequencies of the detections in the first eye aperture input detector 1 and the second eye aperture input detector 2 are the same.

Figure 3A:
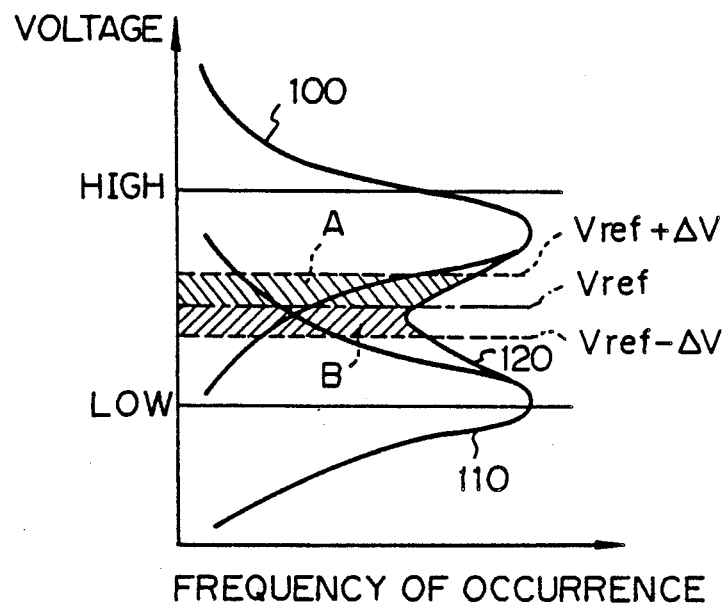
FIG. 3A shows an example of the shifted distribution 100 of voltages of input signals representing the HIGH level.

According to the present invention, if the distribution 100 of the voltage levels of the input signals representing the HIGH level has been shifted down from the HIGH level, as shown in FIG. 3A, the frequency of the detections in the first eye aperture input detector 1 is shown as an area designated region "A", and the frequency of the detections in the second eye aperture input detector 2 is shown as an area designated region "B" in FIG. 3A. Due to the above down shift of the distribution 100, the position of the discrimination level $V_{ref}$ relative to the positions of the two distributions 100 and 110 is deviated toward the distribution 100, and therefore, the area "A" becomes larger than the area "B", i.e., the frequency of the detections by the first eye aperture input detector 1 becomes larger than the frequency of the detections by the second eye aperture input detector 2.

Figure 3B:
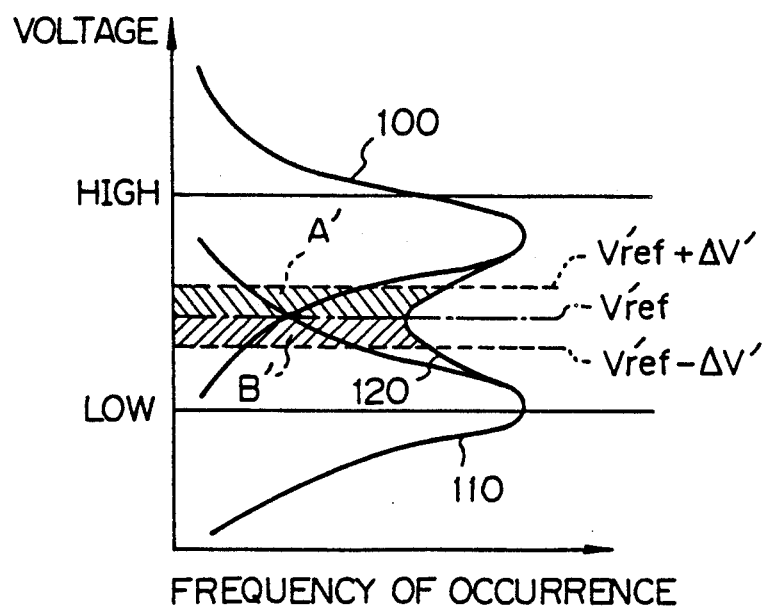
FIG. 3B shows an example of the result of a shifting of the discrimination voltage level corresponding to the shifted distribution 100 in FIG. 3A, according to the present invention.

Corresponding to the above difference between the frequencies of the detections by the first eye aperture input detector 1 and the second eye aperture input detector 2, the level control circuit 3 controls the respective voltages output by the discrimination voltage level generator 4 and the offset reference level generator 5, so that the frequencies of the detections in the first eye aperture input detector 1 and the second eye aperture input detector 2 are the same, i.e., in this case, the level control circuit 3 controls the discrimination voltage level generator 4 and the offset reference level generator 5 to down shift the output voltages $V_{ref}$, $V_{ref}+\Delta V$, and $V_{ref}-\Delta V$ to $V_{ref}'$, $V_{ref}'+\Delta V'$, and $V_{ref}'-\Delta V'$, respectively as shown in FIG. 3B, corresponding to the above difference of the frequencies, i.e., corresponding to the voltage shift of the distribution 100, so that the area "A" becomes equal to the area "B" as shown in FIG. 3B, i.e., the frequency of the detections in the first eye aperture input detector 1 becomes equal to the frequency of the detections in the second eye aperture input detector 2.

Figure 4A:
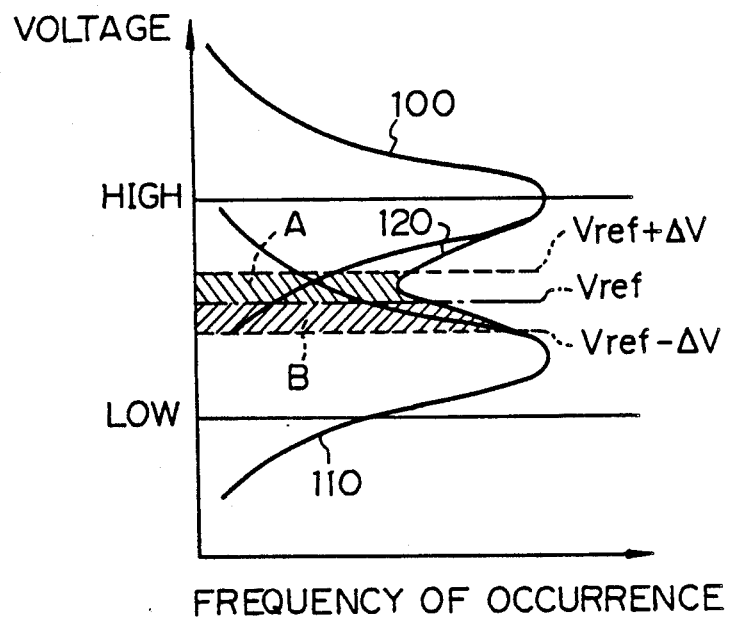
FIG. 4A shows an example of the shifted distribution 110 of voltages of input signals representing the LOW level.

If the distribution 110 of the voltage levels of the input signals representing the LOW level has been shifted up from the LOW level, as shown in FIG. 4A, the position of the discrimination level $V_{ref}$ relative to the positions of the two distributions 100 and 110 is deviated toward the distribution 110, and therefore, the area "B" becomes larger than the area "A", i.e., the frequency of the detections in the second eye aperture input detector 2 becomes larger than the frequency of the detections in the first eye aperture input detector 1.

Figure 4B:
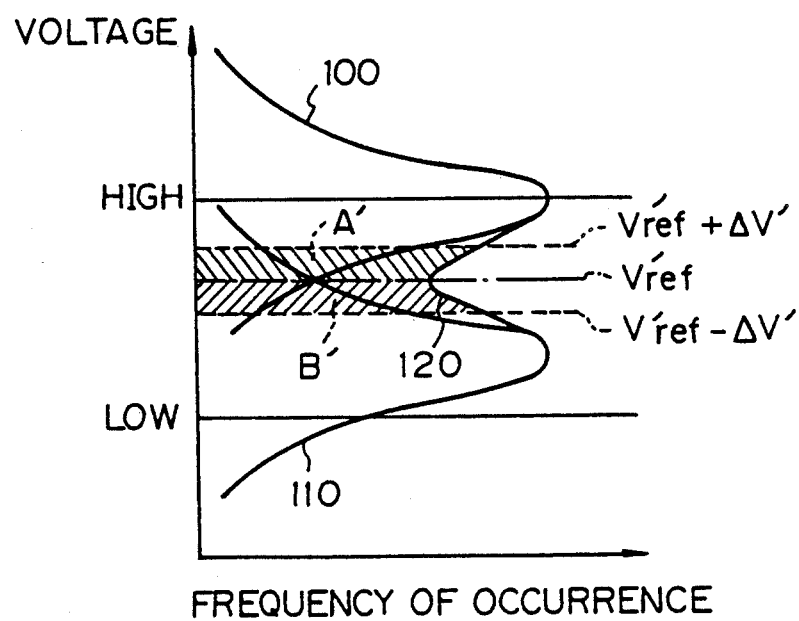
FIG. 4B shows an example of the result of a shifting of the discrimination voltage level corresponding to the shifted distribution 110 in FIG. 4A, according to the present invention.

Corresponding to the above difference between the frequencies of the detections in the first eye aperture input detector 1 and the second eye aperture input detector 2, the level control circuit 3 controls the discrimination level voltage generator 4 and the offset reference level generator 5, to up shift the output voltages $V_{ref}$, $V_{ref}+\Delta V$, and $V_{ref}-\Delta V$ to $V_{ref}'$, $V_{ref}'+\Delta V'$, and $V_{ref}'-\Delta V$, respectively, as shown in FIG. 4B, corresponding to the above difference of the frequencies, i.e., corresponding to the voltage shift of the distribution 110, so that the area "A" becomes equal to the area "B" as shown in FIG. 4B, i.e., the frequency of the detections in the first eye aperture input detector 1 becomes equal to the frequency of the detections in the second eye aperture input detector 2.

As mentioned above, according to the present invention, the deviation of the position of the discrimination level $V_{ref}$ relative to the positions of the two distributions 100 and 110 is detected as the difference between the frequency at which the levels of the input signals lie in the upper half of the vicinity (i.e., the voltage range from the level $V_{ref}-\Delta V$ to the level $V_{ref}+\Delta V$) of the discrimination level (i.e., the "upper half" thereof being the voltage range from $V_{ref}$ to $V_{ref}+\Delta V$) and the frequency that the levels of the input signals lie in the lower half of the vicinity (as above defined) of the discrimination level (i.e., the "lower half" thereof being the voltage range from $V_{ref}-\Delta V$ to $V_{ref}$), and the discrimination level is controlled so that the above difference becomes zero, i.e., the deviation of the position of the discrimination level $V_{ref}$ relative to the positions of the two distributions 100 and 110 is made zero.

Therefore, generally, an error rate when discriminating between different levels of input signals can be reduced regardless of the type of fluctuation of the levels of the input signals, without a manual adjustment, and in particular, in the case of two-state signals, and when the frequency of occurrence of input signals representing the HIGH level and the frequency of occurrence of input signals representing the LOW level can be deemed to be almost the same, the error rate can be further reduced.

Figure 5:
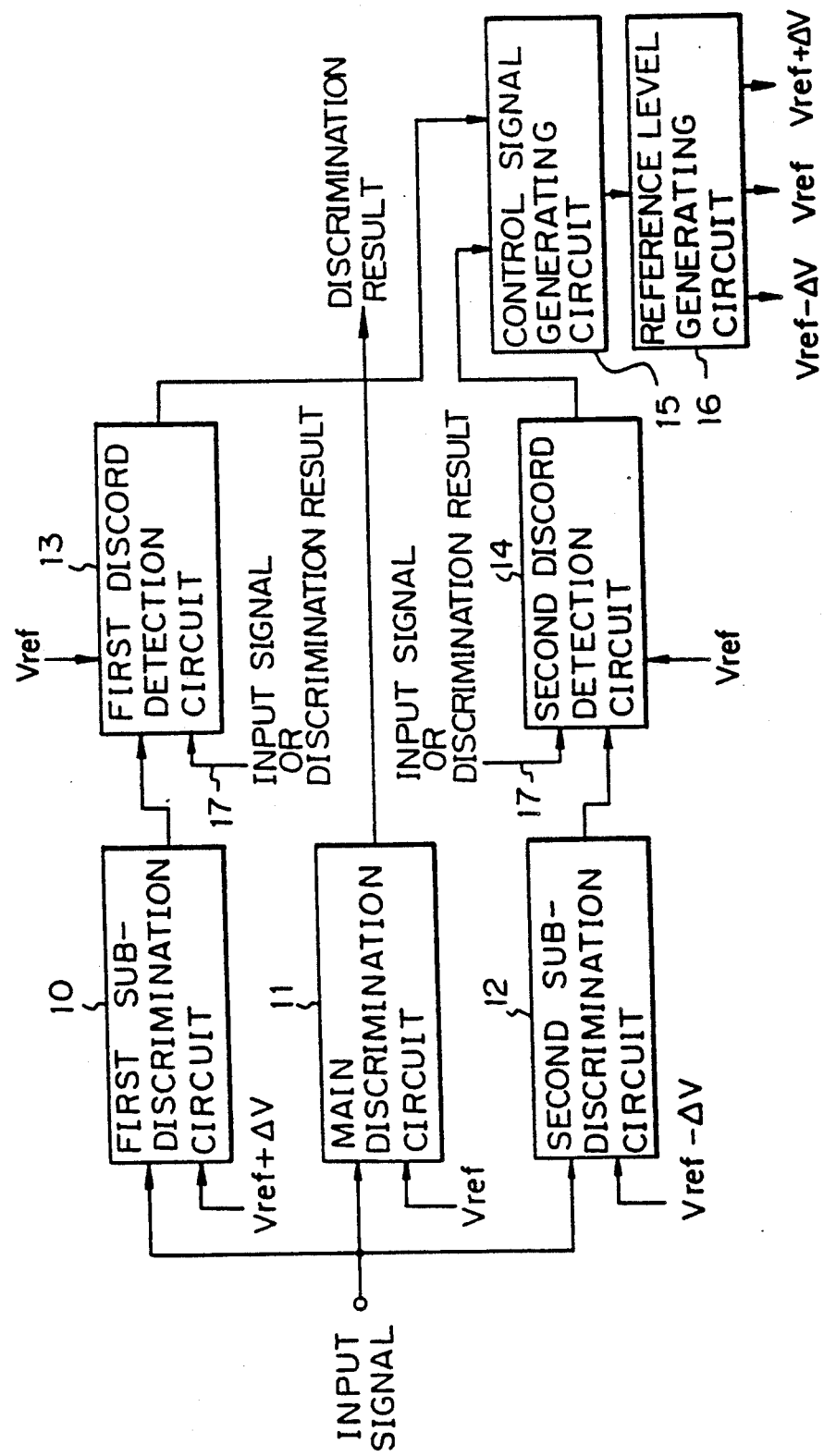
FIG. 5 shows the construction of the first and second embodiments of the present invention.

FIG. 5 is a circuit block diagram commonly representative of operations in accordance with first and second embodiments of the present invention.

In FIG. 5, reference number 10 denotes a first sub-discriminating circuit, 11 denotes a main discrimination circuit, 12 denotes a second sub-discrimination circuit, 13 denotes a first discord detection circuit, 14 denotes a second discord detection circuit, 15 denotes a control signal generating circuit, and 16 denotes a reference level generating circuit.

The main discrimination circuit 11 discriminates between different logic levels of digital input signals, and component parts other than the main discrimination circuit 11 in FIG. 5 commonly represent components selectively operable in accordance with first and second embodiments of the present invention.

The reference level generating circuit 16 generates a discrimination voltage level $V_{ref}$, a plus offset reference level $V_{ref}+\Delta V$, and a minus offset reference level $V_{ref}-\Delta V$.

The discrimination voltage level $V_{ref}$ is supplied to the main discrimination circuit 11, and is used as a reference voltage to discriminate between different levels of input signals.

The plus offset reference level $V_{ref}+\Delta V$ is higher than the discrimination level $V_{ref}$ by a predetermined offset value $\Delta V$, and the minus offset reference level $V_{ref}-\Delta V$ is lower than the discrimination level $V_{ref}$ by the predetermined offset value $\Delta V$.

Namely, the reference level generating circuit 16 corresponds to both of the aforementioned discrimination voltage level generator 4 and the aforementioned offset reference level generator 5 in FIG. 2.

The first sub-discrimination circuit 10 compares the digital input signal with the plus offset reference level $V_{ref}+\Delta V$, and outputs a high level signal or a low level signal respectively, according to whether the level of the input digital signal is higher or lower than the plus offset reference level $V_{ref}+\Delta V$, and the second sub-discrimination circuit 12 compares the digital input signal ("Input Signal") with the minus offset reference level $V_{ref}-\Delta V$, and outputs a high level signal or a low level signal respectively, according to whether the level of the input signal is higher or lower than the minus offset reference level $V_{ref}-\Delta V$.

In the first embodiment of the present invention, the first discord detection circuit 13 detects a discord between the output of the first sub-discrimination circuit 10 and the digital input signal (which is the object of level discrimination in the discrimination circuit 11), and similarly, the second discord detection circuit 14 detects a discord between the output of the second sub-discrimination circuit 12 and the digital input signal.

In the second embodiment of the present invention, the first discord detection circuit 13 detects a discord between the output of the first sub-discrimination circuit 10 and the discrimination result obtained by comparing the digital input signal with the discrimination level (the output of the main discrimination circuit 11), and the second discord detection circuit 14 detects a discord between the output of the second sub-discrimination circuit 12 and the discrimination result obtained by comparing the digital input signal with the discrimination level (the output of the main discrimination circuit 11).

The control signal generating circuit 15 performs the function of the level control circuit 3 in FIG. 2, and the control signal generating circuit 15 also functions as a difference determining means, for determining the difference between the frequencies of the detections in the first and second eye aperture input detector 1 and 2, i.e., the frequencies of the detections in the first and second discord detection circuits 13 and 14, and controls the output of the reference level generator 16, i.e., the discrimination voltage level $V_{ref}$, the plus offset reference level $V_{ref}+\Delta V$, and the minus offset reference level $V_{ref}-\Delta V$, so that the frequencies of the detections in the first and second discord detection circuits 13 and 14, are the same. Namely, the control signal generating circuit 15 causes the reference level generating circuit 16 to raise or lower the output voltage $V_{ref}$ (and accordingly, the plus offset reference level $V_{ref}+\Delta V$ and the minus offset reference level $V_{ref}-\Delta V$) according to the difference between the frequency of the detections in the first discord detection circuit 13 and the frequency of the detections in the second discord detection circuit 14.

The first sub-discrimination circuit 10 and the first discord detection circuit 13 perform the function of the first eye aperture input detector 1 in FIG. 2, and the second sub-discrimination circuit 12 and the second discord detection circuit 14 perform the function of the second eye aperture input detector 2 in FIG. 2.

Figure 6:
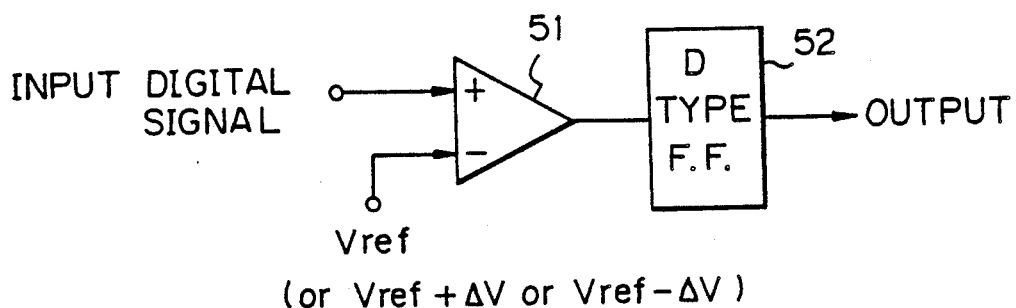
FIG. 6 shows the construction of an example of the main discrimination circuit 11, or the first or second sub-discrimination circuits 10 12.

FIG. 6 shows the construction of an example of the main discrimination circuit 11, and also of each of the first and second sub-discrimination circuits 10 and 12.

In FIG. 6, reference numeral 51 denotes a comparator, and 51 denotes a D-type flip-flop circuit.

As a reference input to the comparator 51 (as commonly exemplifying each of the circuits 11, 10 and 12), there is provided the aforementioned discrimination voltage level $V_{ref}$, as is input to the main discrimination circuit 11, (FIG. 5) the aforementioned plus offset reference level $V_{ref}+\Delta V$, as is input to the first sub-discrimination circuit 10 (FIG. 5), and the aforementioned minus offset reference level $V_{ref}-\Delta V$ as is input to the second sub-discrimination circuit 12 (FIG. 5).

For comparison with these respective reference level inputs the aforementioned digital input signal is input to each of the main discrimination circuit 11, the first sub-discrimination circuit 10, and the second sub-discrimination circuit 12.

In each of the above cases, the output of the comparator 51 is held in the D-type flip-flop circuit 52 in accordance with the timing of each bit input of the digital input signal.

Figure 7:
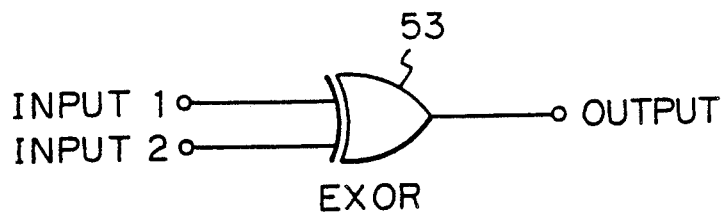
FIG. 7 shows an exclusive OR circuit 53.

Each of the first and second discord detection circuits 13 and 14 can be implemented by an exclusive OR circuit 53 as shown in FIG. 7.

Figure 8:
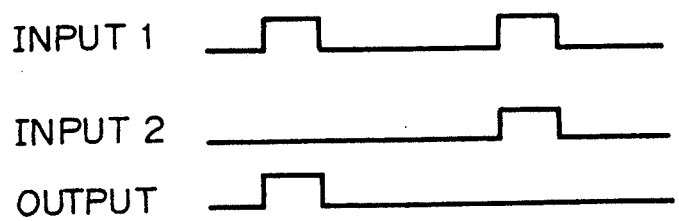
FIG. 8 shows an input-output relationship and a timing of the exclusive OR circuit 53 in FIG. 7.

FIG. 8 shows the input-output relationship and related timing operation of the exclusive OR circuit 53 in FIG. 7. As shown in FIG. 8, when a discord appears between the output of either the first or second sub-discrimination circuit 10 or 12 and the output of the main discrimination circuit 11 in the second embodiment (or when a discord appears between the output of either of the first or second sub-discrimination circuit 10 or 12 and the aforementioned digital input signal in the first embodiment), the corresponding first or second discord detection circuit 13 or 14 outputs an effective pulse signal.

Figure 9:
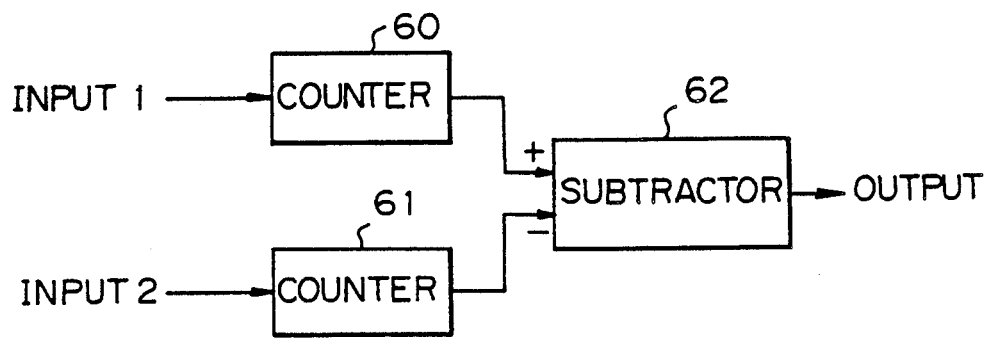
FIGS. 9, 10, 11, and 12 each show a concrete example of the difference obtaining means.
Figure 10:
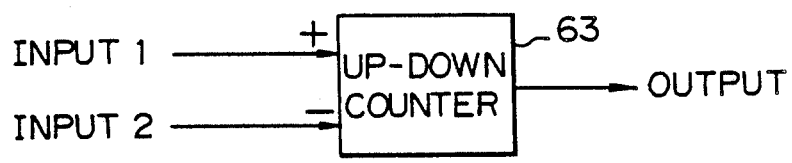
Figure 11:
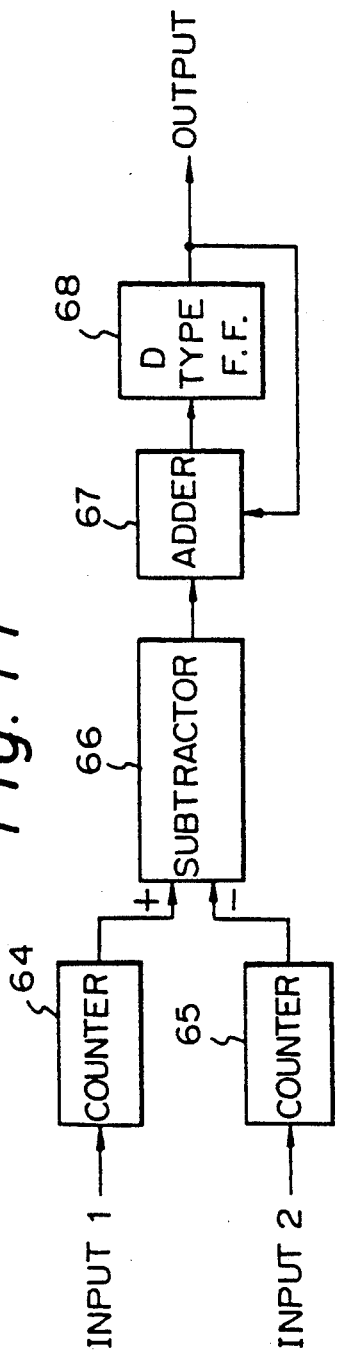

FIGS. 9, 10, and 11 each show a concrete example of the aforementioned difference determining means.

In FIG. 9, reference numerals 60 and 61 denote first and second counters, and 62 denotes a subtractor.

The counter 60 counts the effective pulse signals from the first discord detection circuit 13 as mentioned above, and similarly, the counter 61 counts the effective pulse signals from the second discord detection circuit 14. The difference between the count outputs of the counters 60 and 61 is obtained in the subtractor 62 at a predetermined timed intervals interval, for example, every one second. The counters 60 and 61 are reset before at least one of same overflows.

In FIG. 10, the construction similar to FIG. 9 is implemented by an up-down counter 63 having a count-up input terminal and a count-down input terminal; the count of the counter 63 is incremented at the timing of an input of a new effective pulse from the count-up input and is decremented at the timing of an input of a new effective pulse from the count-down input. Therefore, when the output of the first discord detection circuit 13 is applied to the count-up input, and the output of the second discord detection circuit 14 is applied to the count-down input, the up-down counter 63 outputs the difference between the outputs of the first and second discord detection circuits 13 and 14. In the construction of the FIG. 10, a reset operation of the counter 63 is not necessary.

In FIG. 11, reference numerals 64 and 65 denote first and second counters, 66 denotes a subtractor, 67 denotes an adder, and 68 denotes a D-type flip-flop circuit.

Similar to the construction of the FIG. 9, the counter 64 counts the effective pulse signals from the first discord detection circuit 13 as mentioned above, and the counter 65 counts the effective pulse signals from the second discord detection circuit 14. The difference between the count outputs of the counters 64 and 65 is obtained in the subtractor 66 at predetermined timed intervals, for example, every one second, and then the output of the subtractor 66 is applied to the adder 67 and is added to the output of the D-type flip-flop circuit 68 in the adder 67. The D-type flip-flop circuit 68 holds the output of the adder 67 for each predetermined time interval, i.e., the output of the D-type flip-flop circuit 68 is renewed by the output of the adder 67 at each successive, predetermined time interval.

The counters 64 and 65 also must be reset before one of same overflows, but in this construction, the past data of the difference of the frequencies of the detections in the first and second discord detection circuits 13 and 14 is stored in the D-type flip-flop circuit 68, and is reflected in the output of the construction of FIG. 11 through the adding operation in the adder 67.

Although the up-down counters available on the market tend to operate rather slowly, compared with the simple counters, a function similar to the construction of FIG. 10 can be realized by the construction of FIG. 11, with a faster operation speed.

Figure 12:
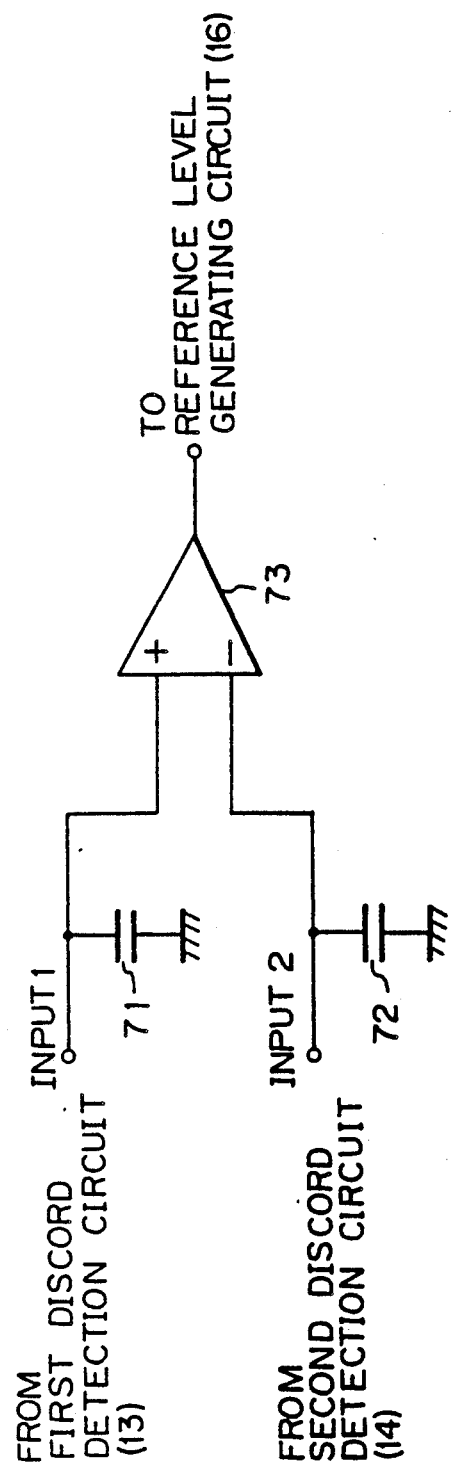

FIG. 12 also shows another concrete example of the aforementioned difference obtaining means.

In FIG. 12, reference numerals 71 and 72 denote first and second accumulation means, for example, capacitors, and 73 denotes a differential amplifier.

Each of the outputs of the first and second discord detection circuits 13 and 14 is applied to the corresponding one of two input terminals INPUT1 and INPUT2, and the charges generated by the aforementioned effective (high voltage) pulses are accumulated in the corresponding one of the capacitors 71 and 72. Accordingly, the voltage developed between the respective terminals of each capacitor is substantially proportional to the number of effective pulses input from the corresponding input terminal, i.e., the frequency of the detections in the corresponding discord detection circuit.

An analog voltage, in proportion to the difference between the voltages accumulated at the capacitors 71 and 72, is produced and output by the differential amplifier 73.

Each of the outputs obtained in the constructions of FIGS. 9, 10, 11, and 12 corresponds to the control output from the level control circuit 3 in FIG. 2.

Figure 13:
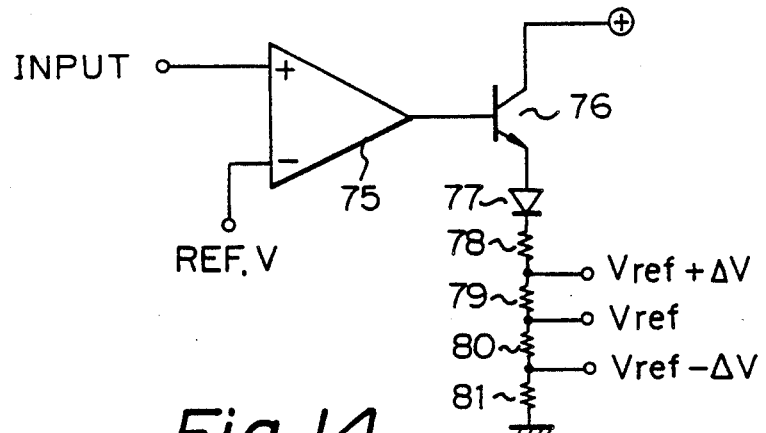
FIG. 13 shows the construction of an example of the reference level generating means 16 in FIG. 5.

FIG. 13 shows the construction of an example of the reference level generator 16 in FIG. 5.

In FIG. 13, reference numeral 75 denotes a linear amplifier, 76 denotes a transistor, 77 denotes a diode, and 78, 79, 80, and 81 denote resistors.

The amplifier 75 comprises a differential amplifier, and a reference voltage is applied to one of the two input terminals of the amplifier 75 and the aforementioned control output of the level control circuit 3, i.e., the output of the control signal generator 15 is applied to the other input of the differential amplifier 75, and thus, the control output is amplified in the amplifier 75, and then applied to the base terminal of the transistor 76.

The collector terminal of the transistor 76 is connected to a high voltage source, and the emitter terminal of the transistor 76 is connected to one terminal of a series connection of the diode 77 and the resistors 78, 79, 80, and 81, where the other terminal of the series connection is connected to ground.

By the above construction, the current flowing in the transistor 76, i.e., the current flows in each of the resistors 78, 79, 80, and 81, is controlled by the base voltage of the transistor 76, i.e., the control output of the level control circuit 3.

Figure 14:
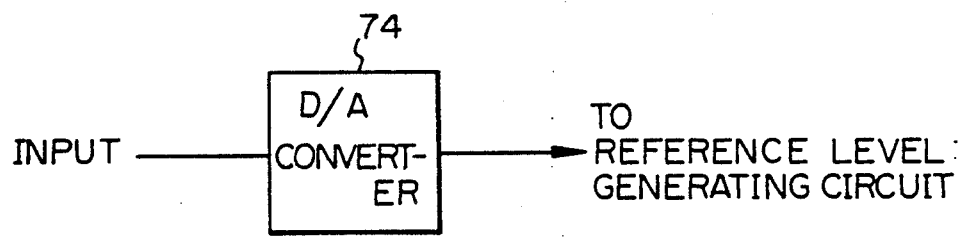
FIG. 14 shows a digital-to-analog converter.

As the input of the construction of FIG. 13 is an analog signal, the analog output of the construction of FIG. 12 can be applied to the input terminal of the construction of FIG. 13, but each of the outputs in the construction of FIG. 9, 10, and 11, as digital data, must be converted to the analog voltage before applied to the construction of FIG. 13, by, for example, a digital-to-analog converter as shown in FIG. 14.

In particular, if the possibility of occurrence of an error is very low, i.e., the frequency of the detections in the first or second discord detection means 13 or 14 is very low, for example, if the possibility is about $1 \times 10^{-8}$, it is impossible to detect the difference of the frequencies by the construction of FIG. 12, and therefore, in such a case, the constructions using counters as shown in FIGS. 9, 10, and 11, are effective.

We claim:

1. A circuit for generating a variable level, reference discrimination voltage used for discriminating between two adjacent logic levels of an input signal which input signal can have a plurality of different voltage levels generally corresponding to a plurality of respective, different logic levels, comprising:

means for generating and producing, as an output, a discrimination reference voltage having a selectively variable voltage level;

an offset reference voltage generating means for generating and producing, as corresponding outputs, a plus offset reference voltage having a variable voltage level which is higher, by a predetermined offset value, than the current voltage level of the discrimination reference voltage and a minus offset reference voltage having a variable voltage level which is lower, by the same predetermined offset value, than the current voltage level of the discrimination reference voltage;

first and second eye aperture input signal detecting means, each receiving as inputs thereto the input signal and the discrimination reference voltage output of the discrimination reference voltage generating means and respectively receiving the plus and minus offset reference voltage outputs of the offset reference voltage generating means, the first eye aperture detecting means detecting and producing a first detection output corresponding to the input signal level being between the respective, current voltage levels of the discrimination reference voltage and the plus offset reference voltage and the second eye aperture detection means detecting and producing a second detection output corresponding to the input signal level being between the respective, current voltage levels of the discrimination reference voltage and the minus offset reference voltage; and said discrimination reference voltage generating means being responsive to the respective frequencies of the first and second detection outputs of the first and second eye aperture detecting means, for the current voltage level of the discrimination reference voltage, for adjusting the voltage level thereof to an adjusted, different voltage level at which the respective frequencies of the first and second detection outputs of said corresponding first and second eye aperture detecting means are equalized.

2. A circuit for generating a discrimination voltage according to claim 1, wherein:

said input signal is a two-value signal;

said first eye aperture input signal detecting means comprises a first sub-discrimination circuit which compares said input signal with said plus offset reference voltage and outputs a high level signal or a low level signal, respectively, according to whether the level of said input signal is higher or lower than the current voltage level of said plus offset reference voltage, and a first discord detection circuit which detects a discord between the output of said first sub-discrimination circuit and said input signal and produces, as an output, a two-value signal having a first value representing the detection of a discord and a second, different value representing the absence of detection of a discord, the first value of the two-value signal output corresponding to the first detection output of said first eye aperture input signal detecting means; and said second eye aperture input signal detecting means comprises a second sub-discrimination circuit which compares said input signal with said minus offset reference voltage and outputs a high level signal or a low level signal respectively according to whether the level of said input signal is higher or lower than the current voltage level of said minus offset reference voltage, and a second discord detection circuit which detects a discord between the output of said second sub-discrimination circuit and said input signal and produces, as an output, a two-value signal having a first value representing the detection of a discord and a second, different value representing the absence of detection of a discord, the second value of the two value signal output corresponding to the second detection output of the second eye aperture input signal detecting means.

3. A circuit for generating a reference discrimination voltage according to claim 2, further comprising:

main discrimination means for receiving the discrimination reference voltage and the input signal and comparing the input signal with the discrimination reference voltage and producing, as a discrimination result output, a two-value signal of first and second values respectively representing the level of the input signal as being above or below the current level of the reference discrimination voltage.

4. A circuit for generating a variable level, reference discrimination voltage according to claim 1, further comprising:

main discrimination means for receiving the discrimination reference voltage and the input signal and comparing the input signal with the discrimination reference voltage and producing, as a discrimination result ouput, a two-value signal of first and second values respectively representing the level of the input signal as being above or below the current level of the reference discrimination voltage;

said first eye aperture input signal detecting means comprises a first sub-discrimination circuit which compares said input signal with said plus offset reference voltage and outputs a high level signal or a low level signal, respectively, according to whether the level of said input signal is higher or lower than the current level of said plus offset reference voltage, and a first discord detection circuit which detects a discord between the output of said first sub-discrimination circuit and the discrimination result output of said main discrimination circuit and produces, as an output, a two-value signal having a first value representing the detection of a discord and a second, different value representing the absence of detection of a discord, the first value of the two-value signal output corresponding to the first detection output of said first eye aperture input signal detecting means; and said second eye aperture input signal detecting means comprises a second sub-discrimination circuit which compares said input signal with said minus offset reference voltage and outputs a high level signal or a low level signal, respectively, according to whether the level of said input signal is higher or lower than the current level of said minus offset reference voltage, and a second discord detection circuit which detects a discord between the output of said second sub-discrimination circuit and the discrimination result output of said main discrimination circuit and produces, as an output, a two-value signal having a first value representing the detection of a discord and a second, different value representing the absence of detection of a discord, the second value of the two value signal output corresponding to the second detection output of the second eye aperture input signal detecting means.

5. A circuit for generating a reference discrimination voltage according to claim 1, wherein:
said discrimination reference voltage generating means comprises difference determining means for determining the difference between the respective frequencies of said detection outputs of said first and second eye aperture input signal detecting means and adjusts the voltage level of the discrimination reference voltage in accordance with said frequency difference.

6. A circuit for generating a reference discrimination voltage according to claim 5, wherein:
said difference determining means comprises first and second counting means for counting the respective first and second detection outputs of said first and second eye aperture input signal detecting means over a predetermined time interval, and subtracting means for receiving and determining the outputs between the respective counts of said first and second counting means.

7. A circuit for generating a discrimination voltage according to claim 5, wherein:
said difference determining means comprises an up-down counter which receives the first and second detection outputs of said first and second eye aperture input detecting means and, in response thereto, respectively increments or decrements the count thereof, the current count, as thus incremented or decremented, representing a current value of the difference between the respective frequencies of said first and second detection outputs of said first and second eye aperture input signal detecting means.

8. A circuit for generating a reference discrimination voltage according to claim 5, wherein said difference determining means comprises:
first and second counting means for counting the respective first and second detection outputs of said first and second eye aperture input signal detecting means over a predetermined time interval, and subtracting means for receiving and determining the difference between the respective counts of said first and second counting means;
an output register which temporarily registers the difference determined by said subtracting means; and
adding means for summing the respective outputs of said subtracting means and said output register and registering said summed outputs in said output register.

9. A circuit for generating a reference discrimination voltage according to claim 8, wherein said difference determining means comprises:
first and second accumulating means for accumulating, as respective analog voltage values said respective frequencies, said first and second detection outputs of said corresponding first and second eye aperture input signal detecting means, each as an analog voltage value, and producing corresponding analog voltage value outputs; and
a differential amplifier which amplifies the difference between the analog voltage value outputs of said first and second accumulating means and produces, as an output, the thus amplified difference therebetween, said discrimination reference voltage generating means being responsive to the amplified difference output for adjusting the voltage level of the discrimination reference voltage.

* * * * *

UNITED STATES PATENT AND TRADEMARK OFFICE
CERTIFICATE OF CORRECTION

PATENT NO. : 5,001,726
DATED : March 19, 1991
INVENTOR(S) : KAWAI et al.

It is certified that error appears in the above-identified patent and that said Letters Patent is hereby corrected as shown below:

TITLE PAGE: [57] ABSTRACT, line 3, change "or" to --of--;
line 14, change "low" to --lower--.

Col. 2, line 12, change "conpensate" to --compensate--;

Col. 4, line 3, change "10 12 and" to --10 and 12--;
line 66, change "high" to --HIGH--.

Col. 5, line 64, delete "means".

Col. 6, line 56, change "$\Delta V$" to --$\Delta V'$--.

Col. 9, line 30, delete "interval";
line 57, after "predetermined" insert --,--.

Signed and Sealed this

Sixth Day of July, 1993

*Attest:*

MICHAEL K. KIRK

*Attesting Officer*   *Acting Commissioner of Patents and Trademarks*